United States Patent
Nakai et al.

(10) Patent No.: US 10,369,497 B2
(45) Date of Patent: Aug. 6, 2019

(54) FOREIGN SUBSTANCE REMOVAL APPARATUS, CIRCULATION SYSTEM AND VEHICLE COOLING SYSTEM

(71) Applicant: MITSUBISHI ELECTRIC CORPORATION, Chiyoda-ku (JP)

(72) Inventors: Takafumi Nakai, Chiyoda-ku (JP); Hironori Kuriki, Chiyoda-ku (JP); Kazuhiro Miya, Chiyoda-ku (JP); Nozomu Yasunaga, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 182 days.

(21) Appl. No.: 15/551,609

(22) PCT Filed: Jan. 21, 2016

(86) PCT No.: PCT/JP2016/051668
§ 371 (c)(1),
(2) Date: Aug. 17, 2017

(87) PCT Pub. No.: WO2016/170809
PCT Pub. Date: Oct. 27, 2016

(65) Prior Publication Data
US 2018/0028943 A1  Feb. 1, 2018

(30) Foreign Application Priority Data
Apr. 20, 2015  (JP) .................. 2015-085988

(51) Int. Cl.
*B04C 5/14*  (2006.01)
*B04C 5/15*  (2006.01)
(Continued)

(52) U.S. Cl.
CPC ..... *B01D 21/2444* (2013.01); *B01D 21/0024* (2013.01); *B01D 21/24* (2013.01);
(Continued)

(58) Field of Classification Search
CPC ........... B01D 21/2444; B01D 21/0024; B01D 21/24; B01D 21/2483; B01D 21/26;
(Continued)

(56) References Cited

U.S. PATENT DOCUMENTS 1,219,796 A * 3/1917 Atkins et al. ............. 210/360.2
2,724,503 A * 11/1955 Fontein .................. B04C 5/081
  209/727
(Continued)

FOREIGN PATENT DOCUMENTS

JP  4-119330 U1  10/1992
JP  6-43222 U  6/1994
(Continued)

OTHER PUBLICATIONS

International Search Report dated Apr. 19, 2016 in PCT/JP2016/051668 filed Jan. 21, 2016.

*Primary Examiner* — Justin M Jonaitis
(74) *Attorney, Agent, or Firm* — Oblon, McClelland, Maier & Neustadt, L.L.P.

(57) ABSTRACT

This invention is a foreign substance removal apparatus that removes foreign substances in such a medium as a refrigerant that flows through a circulation path, the foreign substance removal apparatus including: a foreign substance sedimentation unit which is connected to the circulation path and is configured to settle the foreign substances; a foreign substance separation unit configured to separate, from the foreign substance sedimentation unit, the foreign substances settled in the foreign substance sedimentation unit; first pressure open/close means which is disposed on a bottom of the foreign substance sedimentation unit, and is configured to open or close in accordance with pressure inside the circulation path; and a foreign substance discharge pipe which connects the bottom of the foreign substance sedi-
(Continued)

mentation unit and the foreign substance separation unit via the first pressure open/close means.

16 Claims, 7 Drawing Sheets

(51) Int. Cl.
 *H05K 7/20* (2006.01)
 *B01D 21/00* (2006.01)
 *B01D 21/24* (2006.01)
 *B01D 21/26* (2006.01)
 *F01P 11/06* (2006.01)
 *F28F 19/01* (2006.01)

(52) U.S. Cl.
 CPC ......... *B01D 21/2483* (2013.01); *B01D 21/26* (2013.01); *B01D 21/267* (2013.01); *B04C 5/14* (2013.01); *B04C 5/15* (2013.01); *F01P 11/06* (2013.01); *F28F 19/01* (2013.01); *H05K 7/20263* (2013.01); *H05K 7/20272* (2013.01); *H05K 7/20927* (2013.01)

(58) Field of Classification Search
 CPC ......... B01D 21/2674; B04C 5/14; B04C 5/15; F01D 11/06; F28F 19/01; H05K 7/20263; H05K 7/20272; H05K 7/20927
 USPC ............ 165/95, 71, 134; 137/238, 240, 246, 137/246.12, 15.04, 15.05, 599.14
 See application file for complete search history.

(56) References Cited

U.S. PATENT DOCUMENTS

| | | | | |
|---|---|---|---|---|
| 3,802,570 | A * | 4/1974 | Dehne | B04C 5/14 |
| | | | | 209/720 |
| 3,849,310 | A * | 11/1974 | Condolios | B01D 17/0217 |
| | | | | 210/196 |
| 4,140,632 | A * | 2/1979 | Boivin | B01D 21/267 |
| | | | | 209/731 |
| 2004/0065628 | A1* | 4/2004 | Fout | B01D 19/0057 |
| | | | | 210/788 |
| 2005/0279715 | A1* | 12/2005 | Strong | B01D 17/0211 |
| | | | | 210/774 |

FOREIGN PATENT DOCUMENTS

| | | |
|---|---|---|
| JP | 6-288237 A | 10/1994 |
| JP | 9-166021 A | 6/1997 |
| JP | 2005-268043 A | 9/2005 |
| JP | 2008-289330 A | 11/2008 |
| JP | 2010-29852 A | 2/2010 |
| JP | 2010-162842 A | 7/2010 |
| JP | 2010-240508 A | 10/2010 |
| JP | 2011-72904 A | 4/2011 |
| JP | 2011-210846 A | 10/2011 |
| JP | 2011-230101 A | 11/2011 |

* cited by examiner

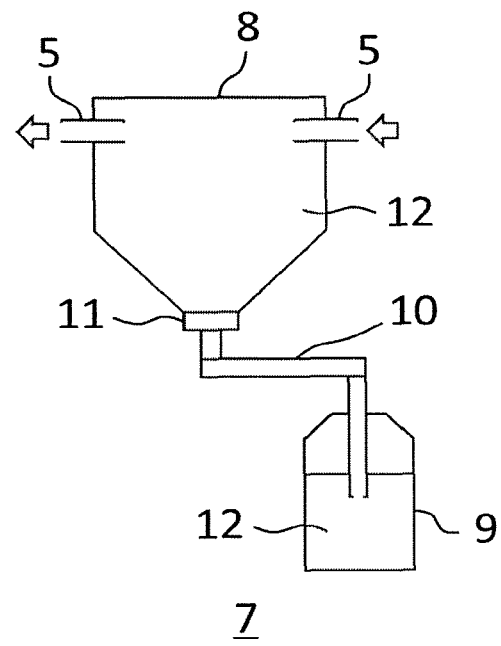

FOREIGN SUBSTANCE REMOVAL APPARATUS, CIRCULATION SYSTEM AND VEHICLE COOLING SYSTEM

TECHNICAL FIELD

The present invention relates to a foreign substance removal apparatus for removing foreign substances in a medium (e.g. refrigerant) which flows through a circulation path (e.g. sealed medium circulation path), and a circulation system and a vehicle cooling system equipped with this foreign substance removal apparatus.

BACKGROUND ART

A circulation system, which uses such liquid as water as a refrigerant, is generally known as a circulation system that is used for cooling such a cooling target object as a CPU (Central Processing Unit), an LSI (Large Scale Integration), an inverter and a power semiconductor. In this circulation system, a circulation path is formed using a metal material having high thermal conductivity (e.g. aluminum, copper), and the cooling target object is cooled by circulating the refrigerant through the circulation path using a circulation pump to cause a heat exchange between the cooling target object and the refrigerant.

In the case of using the above circulation system for a vehicle cooling system, a mixed solution (antifreeze solution), which contains ion-exchanged water having little content impurity, an organic solvent having a low freezing point (e.g. ethylene glycol), and an anti-corrosive agent to suppress corrosion of metal material, is used. The refrigerant is normally exchanged by an apparatus manufacturer, automobile manufacturer, maintenance provider or the like, but may be exchanged by the user in some cases, and for this, tap water may be used instead of ion-exchanged water. Tap water contains corrosive factors that corrode metal material, such as chloride ions, metal ions and dissolved oxygen, hence metal material constituting the circulation path may corrode and enter into the tap water, or the corrosive factors that corrode metal material may precipitate inside the circulation path. Further, tap water also contains scale forming factors, such as calcium ions, magnesium ions, ionic silica and dissolved carbon dioxide, hence scales (e.g. calcium carbonate scales, magnesium carbonate scales, silica scales) may form inside the circulation path. As a result, the circulation path is clogged by these corrosion products or scales, which drops the cooling efficiency of the cooling target object, and increases pump load when the circulation system is operated.

In recent years, as the improvement of cooling target objects (e.g. electronic devices, power semiconductors) accelerate, the heating values of such cooling target objects are increasing. Therefore, the circulation path of the circulation system is miniaturized so as to improve the cooling efficiency of the cooling target object. However, if the circulation path is miniaturized, the clogging of the circulation path occurs more easily, even by micro foreign substances (e.g. corrosion products, scales) that mix in, and the clogging of the circulation path leads to a drop in the cooling efficiency of the cooling target object, and an increase in the pump load when the circulation system is operated.

As described above, the foreign substances that enter the medium, such as refrigerant, clog the circulation path and cause various problems, therefore foreign substances in the medium must be efficiently removed.

PTL 1 proposes a method for removing foreign substances in the medium by disposing a detachable filter in the circulation path. Further, PTL 2 proposes a foreign substance removal apparatus in which a foreign substance sedimentation unit is disposed at a position that branches from the circulation path.

CITATION LIST

Patent Literature

[PTL 1] Japanese Patent Application Publication No. 2011-210846
[PTL 2] Japanese Patent Application Publication No. 2008-289330

SUMMARY OF INVENTION

Technical Problem

The method according to PTL 1 can remove the foreign substances in the medium using a filter, but the filter gradually becomes clogged over time, hence the filter, to which the foreign substances adhere, must be frequently detached and cleaned.

In the case of the foreign substance removal apparatus according to PTL 2, the circulation path and the foreign substance sedimentation unit are divided by a partition wall, but are still connected, therefore the foreign substances may be stirred up and enter the circulation path from the foreign substance sedimentation unit. Furthermore, the circulation path and the foreign substance segmentation unit of this foreign substance removal apparatus are integrated, which makes it difficult to discharge the foreign substances that are settled in the foreign substance sedimentation unit to the outside.

With the foregoing in view, it is an object of the present invention to provide a foreign substance removal apparatus that can remove foreign substances in the medium which circulates through the circulation path, can suppresses the removed foreign substances from being stirred up and flowing into the circulation path again, and can easily discharge the removed foreign substances to the outside, and a circulation system and a vehicle cooling system equipped with this foreign substance remove apparatus.

Solution to Problem

The present invention is a foreign substance removal apparatus that removes foreign substances in a medium that flows through a circulation path, the foreign substance removal apparatus including: a foreign substance sedimentation unit which is connected to the circulation path and is configured to settle the foreign substances; a foreign substance separation unit configured to separate, from the foreign substance sedimentation unit, the foreign substances settled in the foreign substance sedimentation unit; first pressure open/close means which is disposed on a bottom of the foreign substance sedimentation unit, and is configured to open or close in accordance with pressure inside the circulation path; and a foreign substance discharge pipe which connects the bottom of the foreign substance sedimentation unit and the foreign substance separation unit via the first pressure open/close means.

The present invention is also a circulation system in which a cooling device configured to cool a cooling target object using a refrigerant, and a heat radiator configured to cool the refrigerant are connected via a circulation pipe, wherein the foreign substance removal apparatus is disposed in the middle of the circulation pipe.

Further, the present invention is a vehicle cooling system that cools an in-vehicle electronic device, the vehicle cooling system having the circulation system, wherein the cooling target object of the circulation system includes the in-vehicle electronic device.

Advantageous Effects of Invention

According to the present invention, a foreign substance removal apparatus, that can remove foreign substances in the medium which circulates through the circulation path, can prevent the removed foreign substances from being stirred up and flowing into the circulation path again, and can easily discharge the removed foreign substances to the outside, and a circulation system and a vehicle cooling system equipped with this foreign substance removal apparatus can be provided.

BRIEF DESCRIPTION OF DRAWINGS

FIG. 5 is a cross-sectional view of the foreign substance removal apparatus according to Embodiment 1.

DESCRIPTION OF EMBODIMENTS

Figure 1:
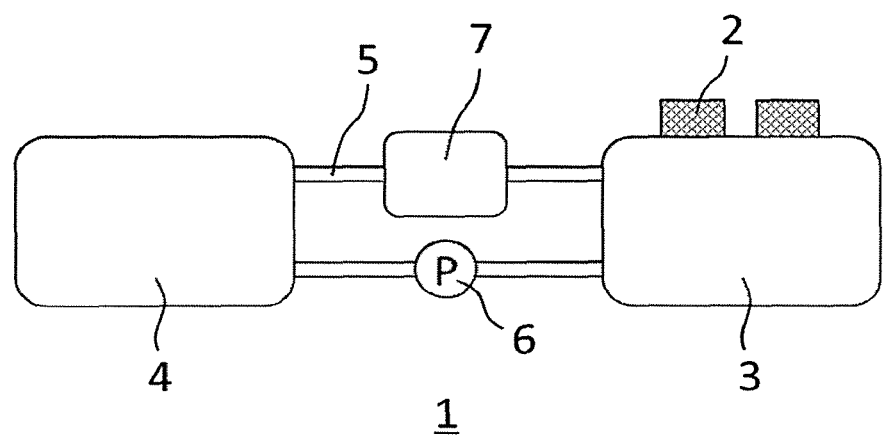
FIG. 1 is a schematic diagram depicting a circulation system which includes a foreign substance removal apparatus according to Embodiment 1.

Embodiments of a foreign substance removal apparatus and a circulation system according to the present invention will be described with reference to the drawings. The present invention, however, is not limited to the embodiments which are described below. The dimensions and shapes of each composing element in the drawings are simplified to make description easier, and may be different from actual dimensions and shapes.

Embodiment 1

FIG. 1 is a schematic diagram depicting a circulation system which includes the foreign substance removal apparatus according to the present embodiment.

In FIG. 1, the circulation system 1 includes: a cooling device 3 which cools a cooling target object 2; a radiator (heat radiator) 4 which cools a refrigerant circulating in the circulation system 1; a circulation pipe 5 which connects the cooling device 3 and the radiator 4; a circulation pump 6 which circulates the refrigerant between the cooling device 3 and the radiator 4; and a foreign substance removal apparatus 7 which is disposed in the middle of the circulation pipe 5. The positions of the circulation pump 6 and the foreign substance removal apparatus 7 are not limited to the positions in FIG. 1, as long as connections are in the middle of the circulation pipe 5, but it is preferable that the foreign substance removal apparatus 7 is connected to a position in the middle of the circulation pipe 5 where the refrigerant flows from the cooling device 3 to the radiator 4. This is because the refrigerant, the temperature of which rises by the heat exchange in the cooling device 3, is introduced to the foreign substance removal apparatus 7, and as a result, first pressure open/close means 11 (described later) of the foreign substance removal apparatus 7 opens more easily when the pressure inside the circulation path increases (that is, the response speed of the first pressure open/close means 11 with respect to the increase in pressure in the circulation path becomes faster), whereby the foreign substance removal effect improves.

In the circulation system 1 having this configuration, the refrigerant cooled by the radiator 4 is introduced to the cooling device 3 by the drive force of the circulation pump 6 via the circulation pipe 5. The refrigerant introduced to the cooling device 3 cools the cooling target object 2 by a heat exchange with the cooling target object 2. The refrigerant, which is heated by the heat exchanged with the cooling target object 2, is introduced to the radiator 4 by the drive force of the circulation pump 6 via the circulation pipe 5, and is cooled by the radiator 4. By circulating the refrigerant between the cooling device 3 and the radiator 4 like this, the cooling target object 2 can be continuously cooled.

The circulation system 1 here is not especially limited as long as the system can circulate the refrigerant as described above. The circulation system 1 can be used for a vehicle cooling system, for example. In the case of using the circulation system 1 for the vehicle cooling system, the flow rate of the refrigerant that circulates through the circulation system 1 can be determined in accordance with the cooling performance of the cooling device 3, and is normally about 5 L/min. or more, 15 L/min. or less.

In this description, an example of using the refrigerant as the medium is primarily described, but needless to say, the present invention can also be applied to a hot water heating system, an air conditions system and the like by using a heat medium, instead of a refrigerant, for the medium.

The cooling target object 2 is not especially limited, and any known heating element in this technical field can be used. Examples of the cooling target object 2 are such electronic components as a CPU, an LSI circuit, an inverter and a power semiconductor.

The cooling device 3 is not especially limited, and any known cooling device in this technical field can be used. The cooling device 3 generally includes a heat sink which plays a role of performing heat exchange between the cooling target object 2 and the refrigerant. In terms of improving the heat exchange efficiency by increasing the contact area with the refrigerant, a channel fin or the like may be disposed. The heat sink is formed of a metal material having high thermal conductivity, such as aluminum, copper and stainless steel.

The radiator 4 and the circulation pipe 5 are not especially limited, and any known radiator and circulation pipe in this technical field can be used.

The temperature of the refrigerant before operating the circulation system 1 is normally an ambient temperature. The temperature of the refrigerant when the circulation system 1 is operating differs depending on the type of the cooling target object 2 or the like. For example, in the case of the vehicle cooling system, the temperature of the refrigerant is about 65° C. in normal operation, and the temperature difference of the refrigerant between the inlet and outlet of the cooling device 3 is 15° C. In concrete terms, the temperature of the refrigerant is about 50° C. at the entrance of the cooling device 3, and the temperature of the refrigerant at the outlet of the cooling device 3 is about 80° C. In the flow channel of the refrigerant inside the cooling device 3, about a 50° C. to 80° C. temperature gradient is generated from the upstream (inlet) side to the downstream (outlet) side.

The refrigerant that circulates between the cooling device 3 and the radiator 4 may include corrosive factors and scale forming factors of the member used for the circulation path, and foreign substances, due to these factors, may mix in. Therefore in this circulation system 1, the foreign substances mixed in the refrigerant are removed by the foreign substance removal apparatus 7.

In this description, "foreign substances" refers to solid foreign substances (e.g. corrosion products, scales) that mix in such a medium as a refrigerant. In this description, "refrigerant" refers to such a liquid as water (ion-exchanged water, tap water), an organic solvent with a low freezing point (e.g. ethylene glycol), an antifreeze solution, and a mixed solution thereof. And in this description, "circulation path" refers to a flow channel where such a medium as a refrigerant circulates, and specifically refers to flow channels in the cooling device 3 and the radiator 4 where the refrigerant flows the circulation pipe 5. In this description, "corrosive factor" of a member used for the circulation path refers to a component that corrodes metal material, such as chloride ions, dissolved oxygen, iron ions and copper ions. And in this description, "scale forming factor" refers to calcium ions, magnesium ions, ionic silica, dissolved carbon dioxide or the like.

Figure 2A:
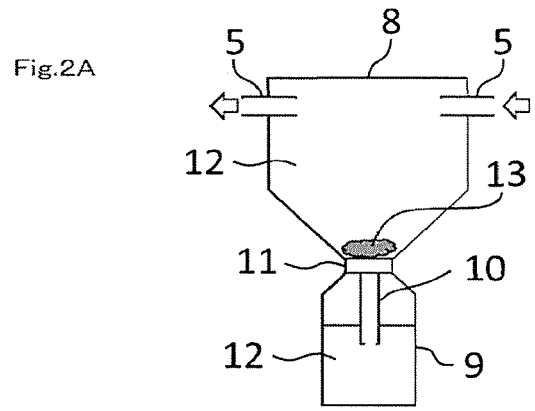
FIG. 2A shows cross-sectional views of the foreign substance removal apparatus according to Embodiment 1.

The foreign substance removal apparatus 7 is disposed in the middle of the circulation path, preferably in the middle of the circulation pipe 5, and even more preferably in the middle of the circulation pipe 5 where the refrigerant flows from the cooling device 3 to the radiator 4. FIG. 2A shows enlarged cross-sectional views of the foreign substance removal apparatus 7 according to the present embodiment.

In FIG. 2A, the foreign substance removal apparatus 7 includes: a foreign substance sedimentation unit 8 which is disposed in the middle of the circulation pipe 5; a foreign substance separation unit 9; a foreign substance discharge pipe 10 which connects the bottom of the foreign substance sedimentation unit 8 and the foreign substance separation unit 9; and first pressure open/close means 11 which is disposed in the foreign substance discharge pipe 10.

The foreign substance sedimentation unit 8 is disposed to settle the foreign substances 13 in the refrigerant 12 to the bottom of the foreign substance sedimentation unit 8 by self weight. The foreign substance sedimentation unit 8 is formed as a part of the circulation path where the refrigerant 12 circulates. The circulation path is filled with the refrigerant 12, and is sealed.

It is preferable that the vertical sectional area of the foreign substance sedimentation unit 8 is larger than the vertical sectional area of a tubular inlet or a tubular outlet of the circulation pipe 5. By this shape, the flow speed of the refrigerant 12, which flows through the foreign substance sedimentation unit 8, decreases, which makes it easier for the foreign substances 13 to settle in the foreign substance sedimentation unit 8. In other words, the foreign substances 13 efficiently settle downward in the vertical direction in the foreign substance sedimentation unit 8 due to a specific gravity difference between the refrigerant 12 and the foreign substances 13, and the refrigerant 12 after the foreign substances 13 are removed can be supplied to the circulation pipe 5.

In this description, "vertical sectional area" refers to the sectional area in the vertical direction with respect to the flowing direction of the refrigerant 12. this description, "tubular inlet of the circulation pipe 5" refers to an opening of the circulation pipe 5 through which the refrigerant 12 is guided to the foreign substance sedimentation unit 8, and "tubular outlet of the circulation pipe 5" refers to an opening of the circulation pipe 5 through which the refrigerant 12 is guided out of the foreign substance sedimentation unit 8.

It is preferable that the horizontal sectional area of the foreign substance sedimentation unit 8 decreases toward the bottom (in the vertical direction). In concrete terms, it is preferable that the wall surface of the foreign substance sedimentation unit 8 is inclined toward the bottom surface. By this shape, the foreign substances 13 are easily collected at the bottom of the foreign substance sedimentation unit 8 to which the foreign substance discharge pipe 10 is connected, hence the foreign substances 13 can be efficiently discharged to the foreign substance separation unit 9.

Figure 3:
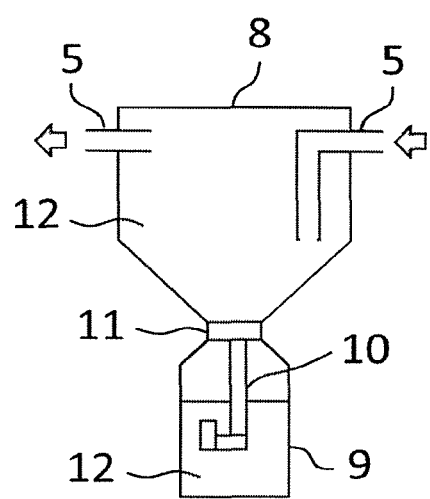
FIG. 3 is a cross-sectional view of the foreign substance removal apparatus according to Embodiment 1.

It is preferable that the circulation pipe 5, which is connected to the foreign substance sedimentation unit 8, is disposed in the upper part of the wall surface of the foreign substance sedimentation unit 8. Further, the tubular inlet of the circulation pipe 5, which guides the refrigerant 12 to the foreign substance sedimentation unit 8, is open in the horizontal direction in FIG. 2A, but may be open downward in the vertical direction as depicted in FIG. 3. If the tubular inlet of the circulation pipe 5 is open downward in the vertical direction, the foreign substances 13 in the refrigerant 12 can be supplied to an area near the bottom of the foreign substance sedimentation unit 8, therefore the foreign substances 13 can be more easily settled on the bottom of the foreign substance sedimentation unit 8. Further, the moving distance of the refrigerant 12 in the foreign substance sedimentation unit 8 increases because the distance between the foreign substance sedimentation unit 8 to the tubular outlet of the circulation pipe 5, which guides the refrigerant 12 out of the foreign substance sedimentation unit 8, increases. As a result, the settling time of the foreign substances 13 in the foreign substance sedimentation unit 8 can be longer, and even foreign substances 13, the specific gravity of which is light, can be more easily settled.

The foreign substance separation unit 9 is disposed to separate the foreign substances 13 that are settled in the foreign substance sedimentation unit 8 from the foreign substance sedimentation unit 8. The foreign substance separation unit 9 also contains the refrigerant 12 and the foreign substances 13 discharged from the bottom of the foreign substance sedimentation unit 8, and supplies the refrigerant 12 when the pressure inside the circulation path decreases.

In other words, in addition to the role of a storage unit to store the foreign substances 13 discharged from the bottom of the foreign substance sedimentation unit 8, the foreign substance separation unit 9 plays a role of a storage unit to store the refrigerant 12, which is discharged from the circulation path when the pressure in the circulation path increases, and is supplied to the circulation path when the pressure in the circulation path decreases. Since this foreign substance separation unit 9 can be used as a reserve tank in a conventional circulation system 1, the circulation system 1 can be downsized.

The foreign substance separation unit 9 is disposed as a member separate from the foreign substance sedimentation unit 8, and is open to the air, and is configured so as to be easily detached from the foreign substance sedimentation unit 8. In the foreign substance separation unit 9, a part of the refrigerant 12 is stored, so that when the pressure inside the circulation path decreases, the refrigerant 12 is supplied from the foreign substance separation unit 9 to the circulation path. Further, in the upper part of the foreign substance separation unit 9, there is a space to store the refrigerant 12 that is discharged from the circulation path when the pressure inside the circulation path increases.

The foreign substance separation unit 9 is connected with the bottom of the foreign substance sedimentation unit 8 via the foreign substance discharge pipe 10. The foreign substance separation unit 9 is disconnected from the foreign substance sedimentation unit 8 by the first pressure open/close means 11 disposed in the foreign substance discharge pipe 10. When the first pressure open/close means 11 is closed (that is, when the foreign substance sedimentation unit 8 and the foreign substance separation unit 9 are disconnected), the refrigerant 12 hardly flows in the foreign substance separation unit 9. Therefore the foreign substances 13 more easily settle on the bottom of the foreign substance separation unit 9 by self weight, and the foreign substances 13 discharged from the foreign substance sedimentation unit 8 to the foreign substance separation unit 9 hardly return to the foreign substance sedimentation unit 8. The foreign substance separation unit 9 is connected with the foreign substance sedimentation unit 8 by opening the first pressure open/close means 11 in accordance with the increase/decrease of the pressure in the circulation path.

Figure 4A:
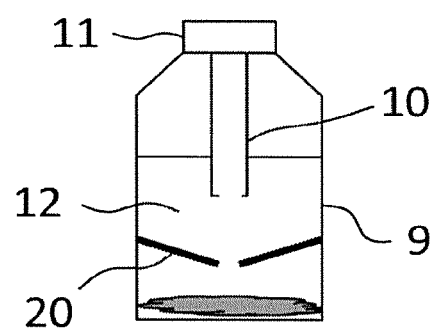
FIG. 4A shows partial cross-sectional views of a foreign substance separation unit of the foreign substance removal apparatus according to Embodiment 1.

As illustrated in FIG. 4A, a division plate 20 may be disposed inside the foreign substance separation unit 9. For example, in the case of using the circulation system 1 for a vehicle cooling system, foreign substances 13 settled on the bottom of the foreign substance separation unit 9 may be stirred up by the vibration of the vehicle, and the foreign substances 13 may flow into the foreign substance sedimentation unit 8 when the first pressure open/close means 11 is opened. However, even if the foreign substances 13 settled on the bottom of the foreign substance separation unit 9 are stirred up by the vibration of the vehicle, the foreign substances 13 collide with the division plate 20 if there is a division plate 20 inside the foreign substance separation unit 9, hence stirring up of the foreign substances 13 beyond the division plate 20 can be suppressed, and the foreign substances 13 are less likely to flow into the foreign substance sedimentation unit 8 when the first pressure open/close means 11 is opened.

It is preferable that the division plate 20, disposed inside the foreign substance separation unit 9, is located at the upper region of the bottom of the foreign substance separation unit 9, such that most of the bottom of the foreign substance separation unit 9 is covered, whereby even if the foreign substances 13 settled on the bottom of the foreign substance separation unit 9 are stirred up, the foreign substances 13 can more easily collide with the division plate 20. In this description, "most of the bottom of the foreign substance separation unit 9" refers to 80% or more, preferable 85% or more, ideally 90% or more, of the bottom area of the foreign substance separation unit 9.

The method of disposing the division plate 20 in an upper region of the bottom of the foreign substance separation unit 9 is not especially limited, but, for example, a part of the division plate 20 is fixed to the side wall of the foreign substance separation unit 9, as illustrated in FIG. 4A. A division plate 20 having legs may be disposed inside the foreign substance separation unit 9.

The number of division plates 20, and a shape, size orientation and the like of each division plate are not especially limited, as long as the above effect is acquired.

Figure 4B:
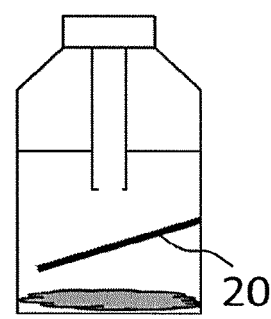
FIG. 4B shows partial cross-sectional views of a foreign substance separation unit of the foreign substance removal apparatus according to Embodiment 1.
Figure 4C:
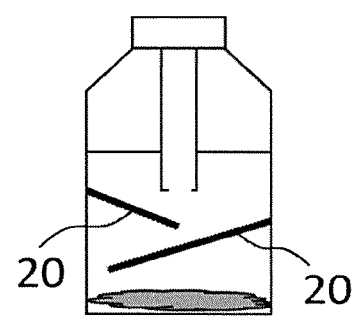
FIG. 4C shows partial cross-sectional views of a foreign substance separation unit of the foreign substance removal apparatus according to Embodiment 1.

For example, the number of division plates 20 may be one as illustrated in FIG. 4B, or may be two as illustrated in FIG. 4A and FIG. 4C. The number of the division plates 20 may be three or more, although this is not illustrated.

The orientation of the division plate 20 may be horizontal (parallel), or inclined, with respect to the bottom of the foreign substance separation unit 9. If a part of the division plate 20 is fixed to the side wall of the foreign substance separation unit 9, it is preferable that the division plate 20 is disposed so as to be inclined downward in the vertical direction from the side wall of the foreign substance separation unit 9 as illustrated in FIG. 4A to FIG. 4C. If the division plate 20 is disposed like this, not only can stirring up of the foreign substances 13 be suppressed, but also the deposition of the foreign substances 13 on the division plate 20 can be prevented, hence the foreign substances 13 can be stably separated from the bottom of the foreign substance separation unit 9.

In the case of using the circulation system 1 for a vehicle cooling system, a vibration proof material, such as vibration proof rubber, may be disposed around the foreign substance separation unit 9, in order to suppress the vibration of the foreign substance separation unit 9 caused by the vibration of the vehicle. It is preferable that the vibration material is disposed between the foreign substance separation unit 9 and a jig to support the foreign substance separation unit 9. If the vibration proof material is disposed like this, vibration of the foreign substance separation unit 9 can be suppressed even if the vehicle vibrates, hence stirring up of the foreign substances 13 settled on the bottom of the foreign substance separation unit 9 can be suppressed, and the foreign substances 13 are less likely to flow into the foreign substance sedimentation unit 8 when the first pressure open/close means 11 is opened.

The foreign substance discharge pipe 10 is disposed to connect the bottom of the foreign substance sedimentation unit 8 and the foreign substance separation unit 9 via the first pressure open/close means 11. The outlet (tip) of the foreign substance discharge pipe 10 connected to the foreign substance separation unit 9 is disposed in a position which is in the refrigerant 12 stored in the foreign substance separation unit 9, and is distant from the bottom of the foreign substance separation unit 9. If the outlet of the foreign substance discharge pipe 10 is disposed in such a position, stirring up of the foreign substances 13 settled on the bottom of the foreign substance separation unit 9 can be suppressed.

The orientation of the outlet of the foreign substance discharge pipe 10 connected to the foreign substance separation unit 9 is not especially limited, and may be downward in the vertical direction, in the horizontal direction, upward in the vertical direction or the like. However, it is preferable that the outlet of the foreign substance discharge pipe 10 connected to the foreign substance separation unit 9 is open upward in the vertical direction, as illustrated in FIG. 3. If the outlet of the foreign substance discharge pipe 10 is opened in this orientation, stirring up of the foreign substance 13 can be suppressed during supplying refrigerant 12 from the foreign substance separation unit 9 to the foreign substance sedimentation unit 8 when the pressure inside the circulation path has decreased, and the effect of preventing the mixing of the foreign substances 13 in the refrigerant 12 can be especially enhanced.

The foreign substance discharge pipe 10 may be extended as illustrated in FIG. 5, so that the distance between the foreign substance sedimentation unit 8 and the foreign substance separation unit 9 is longer. Here the vertical positional relationship between the foreign substance sedimentation unit 8 and the foreign substance separation unit 9 is not especially limited, and the foreign substance sedimentation unit 8 and the foreign substance separation unit 9 may be located at a same height, or the foreign substance separation unit 9 may be located above the foreign substance sedimentation unit 8.

If the foreign substance discharge pipe 10 is extended, the foreign substance separation unit 9 need not be disposed below the foreign substance sedimentation unit 8, hence the installation space is less restricted, and customization improves. Further, maintenance also improves, since the foreign substance separation unit 9 can be disposed in a position where removal is easy. For example, in the case of using the circulation system 1 for a vehicle cooling system, the foreign substance separation unit 9 can be disposed in a position where detachment is easy, such as a position inside a hood (e.g. engine compartment unit) which is opened for periodic inspection, hence the foreign substance separation unit 9 can be detached during periodic inspection, and the foreign substances 13 collected inside the foreign substance separation unit 9 can be cleaned.

The first pressure open/close means 11 is disposed on the bottom of the foreign substance sedimentation unit 8, and opens or closes in accordance with the pressure inside the circulation path (particularly the foreign substance sedimentation unit 8). By bringing the first pressure open/close means 11 into the open state, the foreign substance sedimentation unit 8 and the foreign substance separation unit 9 can be connected via the foreign substance discharge pipe 10. The pressure inside the circulation path, when the first pressure open/close means 11 opens, is not especially limited, and can be appropriately adjusted depending on the intended use of the circulation system 1. In concrete terms, the first pressure open/close means 11 may be configured to open when the pressure inside the circulation path becomes a predetermined value or more, or a predetermined value or less. For example, in the case when the circulation system 1 is used for a vehicle cooling system, and a mixed solution containing water and ethylene glycol is used as the refrigerant 12, the first pressure open/close means 11 opens if the gauge pressure inside the circulation path becomes 0.6 kg/cm$^2$ to 1.6 kg/cm$^2$ (preferably 0.9 kg/cm$^2$ to 1.3 kg/cm$^2$) or 0 kg/cm$^2$ or less. If the first pressure open/close means 11 is set to open at such pressure, the foreign substance removal effect can be implemented while maintaining the cooling performance of the cooling device 3. A commercial radiator cap, for example, can be used as the first pressure open/close means 11 which has the above mentioned function.

FIG. 6 shows cross-sectional views depicting the structure and the function of the first pressure open/close means 11 (radiator cap). The first pressure open/close means 11 has a first open/close valve (main pressure valve) 22 which includes a first pressure response unit 21, and a second open/close valve (negative pressure valve) 24 which includes a second pressure response unit 23. The first pressure response unit 21 and the second pressure response unit 23 are formed of materials that expand and contract in accordance with the pressure (e.g. a spring). The first open/close valve 22 opens or closes in accordance with the expansion/contraction of the first pressure response unit 21 to connect or disconnect the foreign substance sedimentation unit 8 and the foreign substance separation unit 9. The second open/close valve 24 opens or closes in accordance with the expansion/contraction of the second pressure response unit 23 to connect or disconnect the foreign substance sedimentation unit 8 and the foreign substance separation unit 9.

Figure 6A:
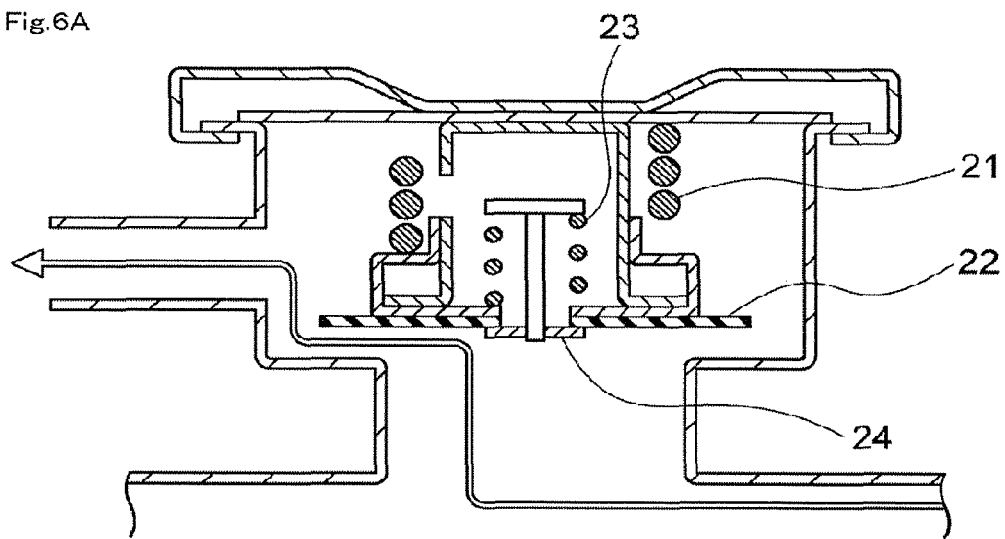
FIG. 6A shows partial cross-sectional view of first pressure open/close means 11.

FIG. 6A is a cross-sectional view of the first pressure open/close means 11 in the case when the pressure inside the circulation path increases. If the pressure inside the circulation path increases, the first pressure response unit 21 contracts, and the first open/close valve 22 is pushed up and enters the open state, and the second pressure response unit 23 expands and the second open/close valve 24 is pushed up and enters the close state. Therefore if the pressure inside the circulation path increases, the foreign substance sedimentation unit 8 and the foreign substance separation unit 9 are connected via the first open/close valve 22 which is in the open state, and the refrigerant 12 flows from the foreign substance sedimentation unit 8 to the foreign substance separation unit 9, so as to relax the pressure inside the circulation path. At this time, the foreign substances 13 settled on the bottom of the foreign substance sedimentation unit 8 is powerfully discharged, along with the refrigerant 12, to the foreign substance separation unit 9.

When the pressure inside the circulation path is relaxed and stabilized thereafter, the first pressure response unit 21 expands and the first open/close valve 22 is pushed down and enters the close state, and the second pressure response unit 23 remains expanded and the second open/close valve 24 enters the close state. Since both the first open/close valve 22 and the second open/close valve 24 enter the close state, the foreign substance sedimentation unit 8 and the foreign substance separation unit 9 are disconnected. Therefore a no flow of the refrigerant 12 is generated between the foreign substance sedimentation unit 8 and the foreign substance separation unit 9.

Figure 6B:
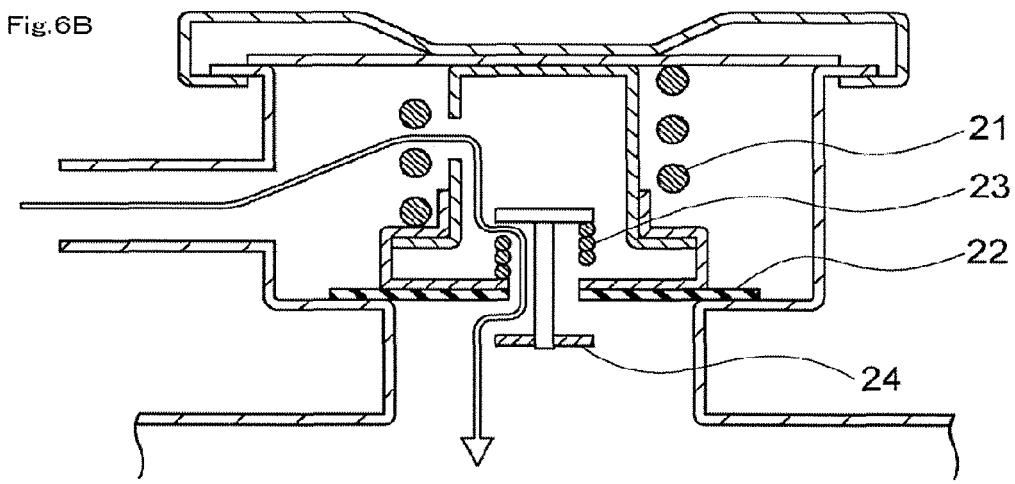
FIG. 6B shows partial cross-sectional view of first pressure open/close means 11.

FIG. 6B is a cross-sectional view of the first pressure open/close means 11 in the case when the pressure inside the circulation path decreased. If the pressure inside the circulation path decreases, the first pressure response unit 21 expands and the first open/close valve 22 is pushed down and enters the close state, and the second pressure response unit 23 contracts and the second open/close valve 24 is pushed down and enters the open state. Therefore if the pressure inside the circulation path decreases, the foreign substance sedimentation unit 8 and the foreign substance separation unit 9 are connected via the second open/close valve 24 which is in the open state, and the refrigerant 12 flows from the foreign substance separation unit 9 to the foreign substance sedimentation unit 8, so as to relax the pressure inside the circulation path. At this time, a part of the refrigerant 12 stored in the foreign substance separation unit 9 is supplied (replenished) to the foreign substance sedimentation unit 8.

In the foreign substance removal apparatus 7 having the above configuration, if foreign substances 13 mix into the refrigerant 12 in the circulation path, the foreign substances 13 settle on the bottom of the foreign substance sedimentation unit 8 (FIG. 2A). The refrigerant 12, from which foreign substances 13 are separated in the foreign substance sedimentation unit 8, are supplied to the circulation pipe 5, and circulate through the circulation path.

Figure 2B:
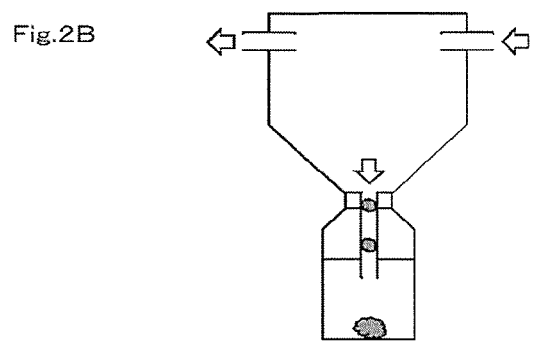
FIG. 2B shows cross-sectional views of the foreign substance removal apparatus according to Embodiment 1.

If the operation of the circulation system 1 is continuous, the temperature of the refrigerant 12 rises from the ambient temperature to about 80° C. At this time, the volume of the refrigerant 12 expands as the temperature increases. However, the circulation path is sealed, hence the pressure inside the circulation path increases. When the first pressure open/close means 11 enters the open state in accordance with the increase of the pressure inside the circulation path, a strong flow of the refrigerant 12 is generated from the foreign substance sedimentation unit 8 to the foreign substance separation unit 9 to decrease (relax) the pressure inside the circulation path. In other words, the refrigerant 12 in the foreign substance sedimentation unit 8 is discharged to the foreign substance separation unit 9 via the foreign substance discharge pipe 10, and the pressure inside the circulation path decreases. At this time, the foreign substances 13 settled on the bottom of the foreign substance sedimentation unit 8 are powerfully discharged along with the refrigerant 12 to the foreign substance separation unit 9 (FIG. 2B). Therefore the efficiency to remove the foreign substances 13 in the foreign substance sedimentation unit 8 is very high.

Figure 2C:
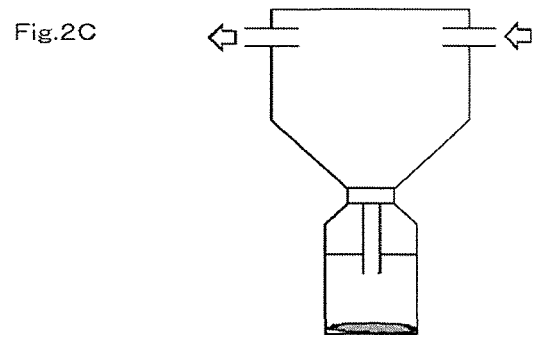
FIG. 2C shows cross-sectional views of the foreign substance removal apparatus according to Embodiment 1.

When the pressure inside the circulation path stabilizes at a predetermined value or less, the first pressure open/close means 11 enters the close state, and the foreign substance sedimentation unit 8 and the foreign substance separation unit 9 are disconnected. After this disconnection, the refrigerant 12 hardly flows in the foreign substance separation unit 9, hence the foreign substances 13 settle on the bottom of the foreign substance separation unit 9 by self weight (FIG. 2C).

Figure 2D:
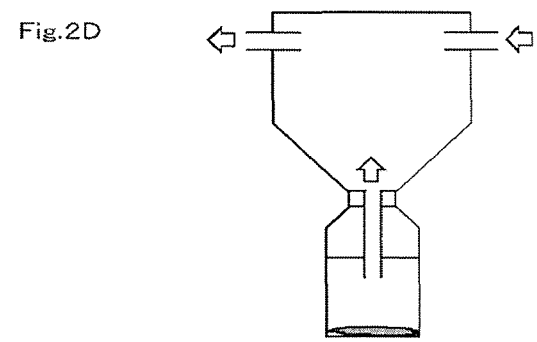
FIG. 2D shows cross-sectional views of the foreign substance removal apparatus according to Embodiment 1.

On the other hand, if the temperature of the refrigerant 12 decreases, as in the case of stopping the operation of the circulation system 1, for example, the volume of the refrigerant 12 shrinks. However, the circulation path is sealed, hence the pressure inside the circulation path decreases. When the first pressure open/close means 11 opens in accordance with the decrease of the pressure inside the circulation path, the refrigerant 12 inside the foreign substance separation unit 9 is supplied to the foreign substance sedimentation unit 8 via the foreign substance discharge pipe 10, and the pressure inside the circulation path increases (FIG. 2D). Since the outlet of the foreign substance discharge pipe 10 is disposed in a position distant from the bottom of the foreign substance separation unit 9, and the foreign substances 13 in the foreign substance separation unit 9 are settled on the bottom, the foreign substances 13 hardly return to the foreign substance sedimentation unit 8 along with the refrigerant 12.

When the pressure inside the circulation path stabilizes at a predetermined value or more, the first pressure open/close means 11 enters the close state, and the foreign substance sedimentation unit 8 and the foreign substance separation unit 9 are disconnected.

The foreign substance separation unit 9 can be easily detached from the foreign substance sedimentation unit 8, so that the foreign substance separation unit 9 can be detected during a periodic inspection or the like, and can be reattached after the foreign substances 13 that collected inside are cleaned by washing. In concrete terms, the foreign substance separation unit 9 is detached in a state depicted in FIG. 2C, and the foreign substances 13 that collected inside are removed by washing. By periodic removal of the foreign substances 13 that collected inside the foreign substance separation unit 9, the return of foreign substances 13 to the foreign substance sedimentation unit 8 along with the refrigerant 12 can be prevented with certainty.

As described above, the use of the foreign substance removal apparatus 7 of the present embodiment allows the removal of the foreign substances 13 in the refrigerant 12 when the pressure inside the circulation path increases, and controls the pressure inside the circulation path.

According to the foreign substance removal apparatus 7 of the present embodiment, the foreign substances 13 in the refrigerant 12 circulating in the circulation path can be removed, and reentry of the removed foreign substances 13 into the circulation path by being stirred up can be suppressed, and the removed foreign substances 13 can be easily discharged. Therefore the circulation system 1 and the vehicle cooling system equipped with this foreign substance removal apparatus 7 hardly causes clogging of the circulation path, and can prevent a drop in the cooling efficiency of the cooling target object 2, and an increase in the pump load during operation can be prevented.

Embodiment 2

Figure 7:
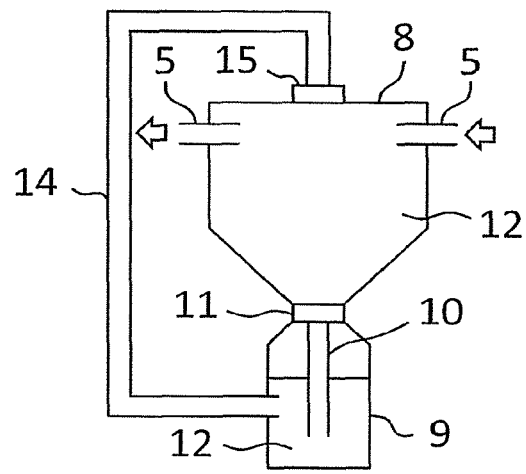
FIG. 7 is a cross-sectional view of a foreign substance removal apparatus according to Embodiment 2.

FIG. 7 is an enlarged cross-sectional view depicting a foreign substance removal apparatus according to the present embodiment. The basic configuration of the foreign substance removal apparatus according to the present embodiment is the same as the foreign substance removal apparatus 7 according to Embodiment 1, hence only differences will be described.

In FIG. 7, the foreign substance removal apparatus 7 according to the present embodiment further includes a medium supply pipe 14 which connects the upper part of the foreign substance sedimentation unit 8 and the foreign substance separation unit 9, and second pressure open/close means 15 which is disposed in the medium supply pipe 14, in addition to the configuration of the foreign substance removal apparatus 7 according to Embodiment 1.

The medium supply pipe 14 is disposed to connect the upper part of the foreign substance sedimentation unit 8 and the foreign substance separation unit 9 via the second pressure open/close means 15. An inlet (tip) of the medium supply pipe 14 connected to the foreign substance separation unit 9 is in the refrigerant 12 stored in the foreign substance separation unit 9, and is in a position distant from the bottom of the foreign substance separation unit 9. If the inlet of the medium supply pipe 14 is disposed in such a position, the inflow of the foreign substances 13 settling on the bottom of the foreign substance separation unit 9 can be prevented.

The orientation of the inlet of the medium supply pipe 14 connected to the foreign substance separation unit 9 is not especially limited, and may be downward in the vertical direction, in the horizontal direction, upward in the vertical direction or the like. In terms of preventing the inflow of the foreign substances 13 from settling on the bottom of the foreign substance separation unit 9, it is preferable that the inlet of the medium supply pipe 14 connected to the foreign substance separation unit 9 is open in the horizontal or in the vertical upward direction.

The second pressure open/close means 15 has a function to open or close according to the decrease of the pressure inside the circulation path, so as to connect or disconnect the foreign substance sedimentation unit 8 and the foreign substance separation unit 9 via the medium supply pipe 14. The pressure inside the circulation path when the second pressure open/close means 15 opens is not especially limited, and can be appropriately adjusted depending on the intended use of the circulation system 1. In concrete terms, the second pressure open/close means 15 may be configured to open when the pressure inside the circulation path becomes a predetermined value or less. For example, in the case when the circulation system 1 is used for the vehicle cooling system, the pressure inside the circulation path can be freely adjusted depending on the type of the refrigerant 12 to be used, for example, but the second pressure open/close means 15 should open if the gauge pressure inside the circulation path becomes 0 kg/cm$^2$ or less.

According to the foreign substance removal apparatus 7 of the present embodiment, when the pressure inside the circulation path increases, the first pressure open/close means 11 enters the open state so as to connect the foreign substance sedimentation unit 8 and the foreign substance separation unit 9 via the foreign substance discharge pipe 10, and when the pressure inside the circulation path decreases, the second pressure open/close means 15 opens so as to connect the foreign substance sedimentation unit 8 and the foreign substance separation unit 9 via the medium supply pipe 14. Therefore unlike the first pressure open/close means 11 used for the foreign substance removal apparatus 7 of Embodiment 1, the first pressure open/close means 11 used for the foreign substance removal apparatus 7 of the present embodiment is only required to have a function to open in accordance with the increase of the pressure inside the circulation path, so as to connect the foreign substance sedimentation unit 8 and the foreign substance separation unit 9 via the foreign substance discharge pipe 10. In concrete terms, the first pressure open/close means 11 may be configured to open when the pressure inside the circulation path becomes a predetermined value or more. The pressure inside the circulation path when the first pressure open/close means 11 opens is not especially limited, and may be appropriately adjusted depending on the intended use of the circulation system 1. For example, in the case when the circulation system 1 is used for a vehicle cooling system, and a mixed solution containing water and ethylene glycol is used as the refrigerant 12, the first pressure open/close means 11 opens if the gauge pressure inside the circulation path becomes 0.6 kg/cm$^2$ to 1.6 kg/cm$^2$ (preferably 0.9 kg/cm$^2$ to 1.3 kg/cm$^2$). If the first pressure open/close means 11 is set to open at such pressure, the foreign substance removal effect can be implemented while maintaining the cooling performance of the cooling device 3.

When the pressure inside the circulation path decreases, the second pressure open/close means 15 enters the open state, and a part of the refrigerant 12 stored in the foreign substance separation unit 9 is supplied to the foreign substance sedimentation unit 8 via the medium supply pipe 14, hence the foreign substance discharge pipe 10 can be disposed near the bottom of the foreign substance separation unit 9. Therefore the foreign substances 13 can be efficiently stored on the bottom of the foreign substance separation unit 9.

In the foreign substance removal apparatus 7 having the above configuration, if the first pressure open/close means 11 enters the open state when the pressure inside the circulation path increases, the foreign substances 13, inside the foreign substance sedimentation unit 8, are discharged to the foreign substance separation unit 9 along with the refrigerant 12, via the foreign substance discharge pipe 10, whereby the pressure inside the circulation path can be decreased at the same time with the removal of the foreign substances 13.

If the second pressure open/close means 15 enters the open state when the pressure inside the circulation path decreases, on the other hand, a part of the refrigerant 12 stored in the foreign substance separation unit 9 is supplied to the foreign substance sedimentation unit 8 via the medium supply pipe 14, and the pressure inside the circulation path can be increased. At this time, the refrigerant 12 is supplied from the upper part of the foreign substance sedimentation unit 8, therefore there is no possibility that the foreign substances 13 settled on the bottom of the foreign substance sedimentation unit 8 are stirred up. As a result, removal of the foreign substances 13 from the foreign substance sedimentation unit 8 and control of the pressure inside the circulation path can be efficiently performed.

According to the foreign substance removal apparatus 7 of the present embodiment, the foreign substances 13 can be even more efficiently removed from the foreign substance sedimentation unit 8, in addition to the effects of the foreign substance removal apparatus 7 of Embodiment 1.

Embodiment 3

Figure 8:
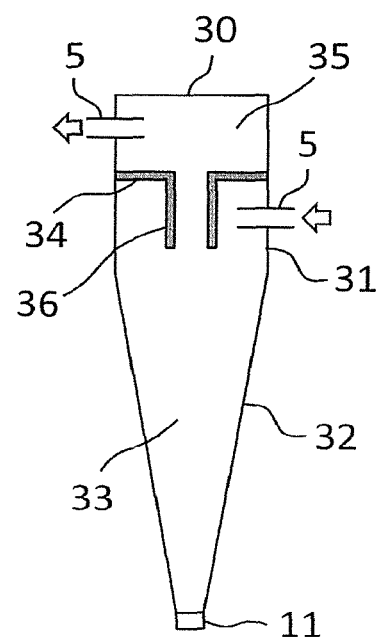
FIG. 8 is a partial cross-sectional view of a liquid cyclone that is used for a foreign substance removal apparatus according to Embodiment 3.

FIG. 8 is an enlarged cross-sectional view depicting a liquid cyclone that is used for a foreign substance removal apparatus according to the present embodiment. The basic configuration of the foreign substance removal apparatus according to the present embodiment is the same as the foreign substance removal apparatus 7 according to Embodiments 1 and 2, except that a liquid cyclone is used for the foreign substance sedimentation unit 8, hence only differences will be described.

In FIG. 8, a liquid cyclone 30 includes: a cyclone main unit 33 constituted by a cylindrical portion 31 and a conical portion 32, the diameter of which gradually decreases downward from the bottom of the cylindrical portion 31; a storage unit 35 which is disposed in an upper part of the cyclone main unit 33, and is defined from inside the cyclone main unit 33 by a partition wall 34; and a connection pipe 36 which is disposed on an axial center line of the vortex flow generated inside the cyclone main unit 33, and connects the inside of the cyclone main unit 33 and the storage unit 35. Further, a tubular inlet of the circulation pipe 5 is disposed in the cylindrical portion 31 of the cyclone main unit 33, and a tubular outlet of the circulation pipe 5 is disposed in the storage unit 35. The tubular inlet of the circulation pipe 5, in particular, is preferably disposed in the tangential direction of the cylindrical portion 31, in order to generate the swirling flow in the cyclone main unit 33.

In the liquid cyclone 30 having the above structure, if the refrigerant 12 containing foreign substances 13 is introduced from the tubular inlet of the circulation pipe 5 to the cyclone main unit 33, the refrigerant 12 flows down along the inner surface of the cyclone main unit 33, becomes a swirling flow. Thereby a vortex flow is generated inside the cyclone main unit 33, and the foreign substances 13 in the refrigerant 12 are separated by centrifugal force caused by this vortex flow. These foreign substances 13 are settled on the bottom of the cyclone main unit 33. The vortex flow which moves down along the inner surface of the cyclone main unit 33 turns in an upward direction near the bottom of the cyclone main unit 33. Thereby an upward vortex flow, moving toward the storage unit 35, is generated on the axial center line of the cyclone main unit 33. This upward vortex flow carries the refrigerant 12 after the foreign substances 13 separated, and this refrigerant 12 is guided to the storage unit 35 by the upward vortex flow, and is discharged from the tubular outlet of the circulation pipe 5.

FIG. 8 is an example of the structure of the liquid cyclone 30, but the structure of the liquid cyclone 30 is not especially limited, as long as the structure allows for a cyclonic separation of the foreign substances 13 in the refrigerant 12 by generating a vortex flow in the refrigerant 12 introduced inside the liquid cyclone 30.

According to the foreign substance removal apparatus 7 of the present embodiment, the foreign substances 13 can be even more efficiently removed from the foreign substance sedimentation unit 8, in addition to the effects of the foreign substance removal apparatus 7 of Embodiment 1 and 2.

The present international application claims priority from Japanese Patent Application No. 2015-085988 filed on Apr. 20, 2015, and the entire content of which are hereby incorporated by reference.

REFERENCE SIGNS LIST

1 Circulation system
2 Cooling target object
3 Cooling device
4 Radiator
5 Circulation pipe
6 circulation pump
7 Foreign substance removal apparatus
8 Foreign substance sedimentation unit
9 Foreign substance separation unit
10 Foreign substance discharge pipe
11 First pressure open/close means
12 Refrigerant
13 Foreign substance
14 Medium supply pipe
15 Second pressure open/close means
20 Division plate
21 First pressure response unit
22 First open/close valve
23 Second pressure response unit
24 Second open/close valve
30 Liquid cyclone
31 Cylindrical portion
32 Conical portion
33 Cyclone main unit
34 Partition wall
35 Storage unit
36 Connection pipe

The invention claimed is:

1. A foreign substance removal apparatus that removes foreign substances in a medium that flows through a circulation path, the foreign substance removal apparatus comprising:
a foreign substance sedimentation unit which is connected to the circulation path and is configured to settle the foreign substances;
a foreign substance separation unit configured to separate, from the foreign substance sedimentation unit, the foreign substances settled in the foreign substance sedimentation unit;
first pressure open/close means which is disposed on a bottom of the foreign substance sedimentation unit, and is configured to open or close in accordance with pressure inside the circulation path; and
a foreign substance discharge pipe which connects the bottom of the foreign substance sedimentation unit and the foreign substance separation unit via the first pressure open/close means, wherein
when the pressure inside the circulation path increases, the first pressure open/close means enters an open state, the medium in the foreign substance sedimentation unit is discharged to the foreign substance separation unit via the foreign substance discharge pipe, and then the first pressure open/close means enters a close state,
when the pressure inside the circulation path decreases, the first pressure open/close means enters the open state, and a part of the medium stored in the foreign substance separation unit is supplied to the foreign substance sedimentation unit via the foreign substance discharge pipe, and
the foreign substances, which are settled in the foreign substance sedimentation unit, are separated in the foreign substance separation unit by the opening/closing of the first pressure open/close means.

2. The foreign substance removal apparatus according to claim 1, wherein
a part of the medium is stored in the foreign substance separation unit, and an outlet of the foreign substance discharge pipe is located in a part of the stored medium.

3. The foreign substance removal apparatus according to claim 1, wherein
the first pressure open/close means includes a first open/close valve which enters an open state when the pressure inside the circulation path increases, and a second open/close valve which enters an open state when the pressure inside the circulation path decreases.

4. A foreign substance removal apparatus that removes foreign substances in a medium that flows through a circulation path, the foreign substance removal apparatus comprising:
a foreign substance sedimentation unit which is connected to the circulation path and is configured to settle the foreign substances;
a foreign substance separation unit configured to separate, from the foreign substance sedimentation unit, the foreign substances settled in the foreign substance sedimentation unit;
first pressure open/close means which is disposed on a bottom of the foreign substance sedimentation unit, and is configured to open or close in accordance with pressure inside the circulation path;
a foreign substance discharge pipe which connects the bottom of the foreign substance sedimentation unit and the foreign substance separation unit via the first pressure open/close means;
second pressure open/close means which is disposed in an upper part of the foreign substance sedimentation unit and is configured to open/close in accordance with the pressure inside the circulation path; and a medium supply pipe which connects the foreign substance separation unit and the foreign substance sedimentation unit via the second pressure open/close means, wherein
the foreign substances, which are settled in the foreign substance sedimentation unit, are separated in the foreign substance separation unit by the opening/closing of the first pressure open/close means,
a part of the medium is stored in the foreign substance separation unit, and an outlet of the foreign substance discharge pipe is located in the stored medium,
when the pressure inside the circulation path increases, the first pressure open/close means enters an open state, the medium in the foreign substance sedimentation unit is discharged to the foreign substance separation unit via the foreign substance discharge pipe, and then the first pressure open/close means enters a close state, and
when the pressure inside the circulation path decreases, the second pressure open/close means enters an open state, and a part of the medium stored in the foreign substance separation unit is supplied to the foreign substance sedimentation unit via the medium supply pipe.

5. The foreign substance removal apparatus according to claim 1, wherein
the circulation path includes a tubular inlet configured to guide the medium into the foreign substance sedimentation unit, and a tubular outlet configured to guide the medium in the foreign substance sedimentation unit to outside of the foreign substance sedimentation unit, and
a vertical sectional area inside the foreign substance sedimentation unit is larger than vertical sectional areas of the tubular inlet and the tubular outlet.

6. The foreign substance removal apparatus according to claim 1, wherein
a horizontal sectional area of the foreign substance sedimentation unit decreases toward the bottom.

7. The foreign substance removal apparatus according to claim 1, wherein
the foreign substance sedimentation unit is disposed in the middle of a circulation pipe.

8. The foreign substance removal apparatus according to claim 7, wherein
a tubular inlet of the circulation pipe configured to guide the medium into the foreign substance sedimentation unit opens downward in the vertical direction.

9. The foreign substance removal apparatus according to claim 1, wherein
a division plate configured to suppress the stirring up of the foreign substances settled on a bottom of the foreign substance separation unit is disposed inside the foreign substance separation unit.

10. The foreign substance removal apparatus according to claim 1, wherein
the foreign substance sedimentation unit is a liquid cyclone configured to cyclone-separate the foreign substances in the medium by generating a vortex flow in the medium introduced inside the foreign substance sedimentation unit.

11. The foreign substance removal apparatus according to claim 10, wherein
the liquid cyclone includes:
a cyclone main unit constituted by a cylindrical portion and a conical portion, the diameter of which gradually decreases downward from a bottom of the cylindrical portion;
a storage unit which is disposed in an upper part of the cyclone main unit, and is defined from inside of the cyclone main unit by a partition wall; and
a connection pipe which is disposed on an axial center line of a vortex flow generated inside the cyclone main unit, and connects the inside of the cyclone main unit and the storage unit, and
a tubular inlet of the circulation path is disposed in the cylindrical portion of the cyclone main unit, and a tubular outlet of the circulation path is disposed in the storage unit.

12. The foreign substance removal apparatus according to claim 1, wherein
the foreign substance separation unit is open to air.

13. The foreign substance removal apparatus according to claim 1, wherein
an outlet of the foreign substance discharge pipe opens upward in the vertical direction.

14. The foreign substance removal apparatus according to claim 1, wherein
the medium is a refrigerant.

15. A circulation system in which a cooling device configured to cool a cooling target object using a refrigerant, and a heat radiator configured to cool the refrigerant are connected via a circulation pipe, wherein
the foreign substance removal apparatus according to claim 14 is disposed in the middle of the circulation pipe.

16. A vehicle cooling system that cools an in-vehicle electronic device,
the vehicle cooling system comprising the circulation system according to claim 15, wherein
the cooling target object of the circulation system includes the in-vehicle electronic device.

* * * * *